United States Patent
Naito

(10) Patent No.: US 10,109,726 B2
(45) Date of Patent: Oct. 23, 2018

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/364,264

(22) Filed: Nov. 30, 2016

(65) Prior Publication Data

US 2017/0084727 A1    Mar. 23, 2017

Related U.S. Application Data

(63) Continuation of application No. PCT/JP2015/076122, filed on Sep. 15, 2015.

(30) Foreign Application Priority Data

Dec. 19, 2014 (JP) ................ 2014-256785

(51) Int. Cl.
*H01L 29/73* (2006.01)
*H01L 29/739* (2006.01)
(Continued)

(52) U.S. Cl.
CPC ........ *H01L 29/7397* (2013.01); *H01L 21/265* (2013.01); *H01L 21/82285* (2013.01);
(Continued)

(58) Field of Classification Search
CPC ............ H01L 29/7397; H01L 29/0696; H01L 29/4238; H01L 29/407; H01L 29/0619; H01L 29/66348; H01L 20/1095; H01L 27/0825; H01L 21/82285; H01L 21/265; H01L 21/78
See application file for complete search history.

(56) References Cited

U.S. PATENT DOCUMENTS

| 5,278,441 A | 1/1994 | Kang et al. |
| 5,329,142 A | 7/1994 | Kitagawa et al. |

(Continued)

FOREIGN PATENT DOCUMENTS

| JP | H8-316479 A | 11/1996 |
| JP | 2003-347549 A | 12/2003 |
| JP | 2007-324539 A | 12/2007 |

OTHER PUBLICATIONS

International Search Report for International Application No. PCT/JP2015/076122, issued by the Japan Patent Office dated Dec. 15, 2015.

*Primary Examiner* — William Coleman

(57) ABSTRACT

A semiconductor device including a mesa portion formed on a front surface side of a semiconductor substrate; a floating portion formed on the front surface side of the semiconductor substrate; a trench formed surrounding the floating portion and separating the mesa portion from the floating portion; an electrode formed inside the trench; and an outside wiring portion formed along an arrangement direction of the mesa portion and the floating portion, outside the region surrounded by the trench. An edge of the outside wiring portion on the mesa portion and floating portion side includes a protruding portion formed in at least part of a region opposite the floating portion and protruding beyond the trench toward the floating portion side, and a recessed portion formed in at least part of a region opposite the mesa portion and recessed to the outside wiring portion side farther than the protruding portion.

13 Claims, 18 Drawing Sheets

(51) Int. Cl.
*H01L 29/78* (2006.01)
*H01L 21/265* (2006.01)
*H01L 21/8228* (2006.01)
*H01L 27/082* (2006.01)
*H01L 29/10* (2006.01)
*H01L 29/66* (2006.01)
*H01L 29/40* (2006.01)
*H01L 29/423* (2006.01)
*H01L 29/06* (2006.01)

(52) U.S. Cl.
CPC ...... *H01L 27/0825* (2013.01); *H01L 29/0619* (2013.01); *H01L 29/0696* (2013.01); *H01L 29/1095* (2013.01); *H01L 29/407* (2013.01); *H01L 29/4238* (2013.01); *H01L 29/66348* (2013.01); *H01L 29/78* (2013.01)

(56) References Cited

U.S. PATENT DOCUMENTS

| | | |
|---|---|---|
| 6,118,150 A | 9/2000 | Takahashi |
| 7,345,342 B2 * | 3/2008 | Challa .................. H01L 21/3065 257/331 |
| 8,680,610 B2 * | 3/2014 | Hsieh .................... H01L 27/088 257/302 |
| 9,054,154 B2 * | 6/2015 | Onozawa ............ H01L 29/4236 |
| 9,064,839 B2 * | 6/2015 | Matsuura ................ H01L 29/36 |
| 9,236,461 B2 * | 1/2016 | Hikasa ................ H01L 29/7397 |
| 9,543,421 B2 * | 1/2017 | Hikasa ............. H01L 29/66348 |
| 9,595,602 B2 * | 3/2017 | Hashimoto ......... H01L 29/7397 |
| 9,954,086 B2 * | 4/2018 | Onozawa ........... H01L 29/7397 |
| 2001/0054738 A1 | 12/2001 | Momota et al. |
| 2002/0048915 A1 | 4/2002 | Reznik |
| 2002/0190313 A1 | 12/2002 | Takaishi et al. |
| 2006/0163649 A1 | 7/2006 | Otsuki |
| 2008/0191238 A1 * | 8/2008 | Madathil ............ H01L 29/7397 257/133 |
| 2009/0111230 A1 | 4/2009 | Nishimura |
| 2011/0260212 A1 | 10/2011 | Tsuzuki et al. |
| 2015/0270387 A1 * | 9/2015 | Kumada ............ H01L 29/7397 257/140 |
| 2016/0211354 A1 * | 7/2016 | Ikura ..................... H01L 29/402 |
| 2016/0365413 A1 * | 12/2016 | Wagner .............. H01L 29/1095 |

* cited by examiner

SEMICONDUCTOR DEVICE AND SEMICONDUCTOR DEVICE MANUFACTURING METHOD

The contents of the following Japanese patent applications are incorporated herein by reference:
NO. 2014-256785 filed in JP on Dec. 19, 2014, and
NO. PCT/JP2015/076122 filed on Sep. 15, 2015.

BACKGROUND

1. Technical Field

The present invention relates to a semiconductor device and a semiconductor device manufacturing method.

2. Related Art

A structure for a semiconductor device such as an IGBT is known in which the surface area of an emitter region connected to the emitter electrode is reduced by providing floating regions in the substrate surface on the emitter side, as shown in Patent Documents 1 and 2, for example. Furthermore, each floating region is separated from other regions by a gate trench, and channel layers or the like are formed between respective floating regions. For example, as shown in FIG. 9 of Patent Document 2, a gate electrode in a gate trench is connected to a wiring portion arranged outside of the floating regions.

Patent Document 1: Japanese Patent Application Publication No. 2007-324539
Patent Document 2: Japanese Patent Application Publication No. 2011-243946

The wiring portion is preferably capable of reliably connecting to the gate electrode. Furthermore, the channel layer or the like preferably has a shape allowing for easy formation of other structures.

SUMMARY

According to a first aspect of the present invention, provided is A semiconductor device comprising at least one of a mesa portion, a floating portion, a trench, an electrode, and an outside wiring portion. The mesa portion may be formed on a front surface side of a semiconductor substrate. The floating portion may be formed on the front surface side of the semiconductor substrate. The trench may be formed surrounding the floating portion. The trench may separate the mesa portion from the floating portion. The electrode may be formed inside the trench. The outside wiring portion may be formed along an arrangement direction of the mesa portion and the floating portion, outside of the region surrounded by the trench. An edge of the outside wiring portion on the mesa portion and floating portion side may include a protruding portion and a recessed portion. The protruding portion may be formed in at least a portion of a region opposite the floating portion. The protruding portion may protrude beyond the trench toward the floating portion side. The recessed portion may be formed in at least a portion of a region opposite the mesa portion. The recessed portion may be recessed to the outside wiring portion side farther than the protruding portion.

The semiconductor device may further comprise a well region. The well region may have a second conductivity type. The well region may be formed between an end of the semiconductor substrate and the mesa portion and floating portion.

The mesa portion may have a base region with a second conductivity type. The base region and the well region may be connected to each other. The base region may be formed using the outside wiring portion as a mask, after the well region has been formed. The recessed portion may be recessed to the outside wiring portion side to a position enabling the base region and the well region to connect to each other.

A tip of the recessed portion may be arranged farther to the outside wiring portion side than a position that protrudes by 0.75 times a depth of the base region toward the inside of the mesa portion from an end of the well region. The tip of the recessed portion may be arranged farther on the outside wiring portion side than the trench.

The floating portion may have a second conductivity type, and a region having the second conductivity type in the floating portion that is covered by the protruding portion may be connected to the trench. The floating portion may be formed using the outside wiring portion as a mask, after the trench has been formed. The protruding portion may have a length that enables the region of the floating portion having the second conductivity type to connect to the trench below the protruding portion.

Length of a region of the protruding portion overlapping with the floating portion may be less than or equal to 0.75 times a depth of the floating portion. Width of the protruding portion may be less than width of the floating portion. Width of the recessed portion may be greater than width of the mesa portion.

According to a second aspect of the present invention, provided is semiconductor device manufacturing method comprising on a front surface side of a semiconductor substrate, forming a trench that surrounds a predetermined region. The manufacturing method may include forming a floating portion surrounded by the trench, and forming a mesa portion separated from the floating portion. The manufacturing method may include forming an electrode in the trench and forming an outside wiring portion along an arrangement direction of the mesa portion and the floating portion outside of the region surrounded by the trench. The manufacturing method may include doping the mesa portion and the floating portion with impurities having a predetermined conductivity type, using the outside wiring portion as a mask, and diffusing the impurities. Forming the outside wiring portion may include forming, on an edge of the outside wiring portion on the mesa portion and floating portion side, a protruding portion and a recessed portion. The protruding portion may be formed in at least a portion of a region opposite the floating portion. The protruding portion may protrude beyond the trench toward the floating portion side. The recessed portion may be formed in at least a portion of a region opposite the mesa portion. The recessed portion may be recessed to the outside wiring portion side farther than the protruding portion.

The semiconductor substrate may have a first conductivity type. The manufacturing method may include, before forming the trench, forming a well region that has a second conductivity type between an end of the semiconductor substrate and the mesa portion and floating portion.

The doping with the impurities and diffusing the impurities may include doping with impurities having a second conductivity type and diffusing the impurities to form a base region connected to the well region in the mesa portion. The doping with the impurities and diffusing the impurities may include doping with impurities having a second conductivity type, diffusing the impurities, and connecting a region having the second conductivity type in the floating portion covered by the protruding portion to the trench.

The summary clause does not necessarily describe all necessary features of the embodiments of the present inven-

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
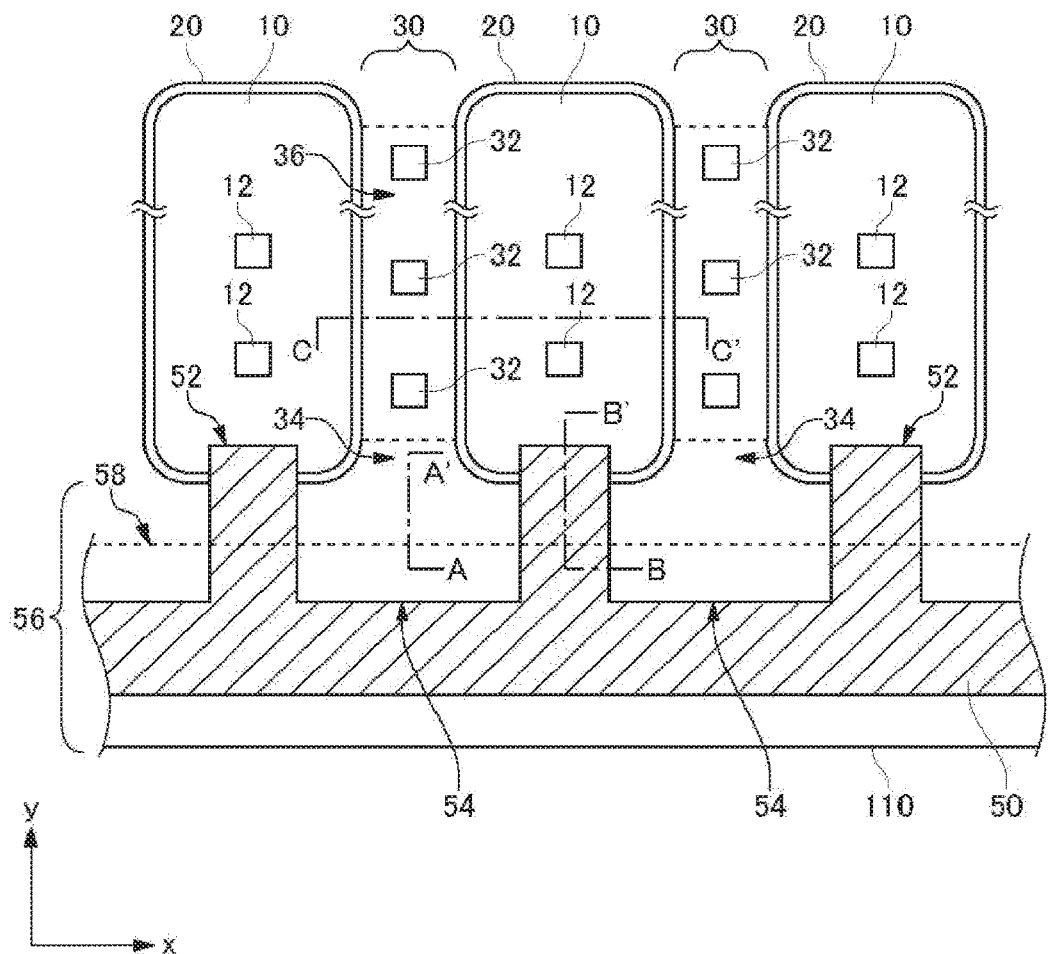
FIG. 1 is a planar view of an exemplary semiconductor device 100.

FIG. 1 is a planar view of an exemplary semiconductor device 100. The semiconductor device 100 in this example is a semiconductor chip. FIG. 1 shows the chip front surface around a chip end portion, and does not show other regions. The semiconductor device 100 includes a semiconductor substrate 110, a plurality of floating portions 10, a plurality of trenches 20, a plurality of mesa portions 30, and an outside wiring portion 50. The floating portions 10, the trenches 20, the mesa portions 30, and the outside wiring portion 50 are formed on the front surface side of the semiconductor substrate 110.

The mesa portions 30 and the floating portions 10 are arranged along a prescribed arrangement direction. In this example, the mesa portions 30 and the floating portions 10 are arranged in an alternating manner along an x direction that is parallel to a prescribed edge of the semiconductor substrate 110. In this example, the mesa portions 30 and the floating portions 10 each have a longitudinal direction in a y direction that is perpendicular to the x direction.

Each floating portion 10 has a shape in the front surface of the semiconductor substrate 110 that is, for example, an oval with a longitudinal direction in the y direction, a rectangle with vertices rounded into curves, or the like. Each mesa portion 30 is formed between a plurality of floating portions 10 arranged at a distance from each other in the x direction.

The trenches 20 are provided respectively for the floating portions 10. Each trench 20 is formed on the front surface of the semiconductor substrate 110 in a manner to surround the corresponding floating portion 10. In this way, the mesa portions 30 and the floating portions 10 are separated from each other. Electrodes are formed within the trenches 20. Furthermore, an insulating film is formed between the electrodes and the inner walls of the trenches 20. In this example, the electrodes function as gate electrodes in a power semiconductor element having a trench gate structure, for example.

In each mesa portion 30, a base region 34, an emitter region 36, and a buried region 32 are formed. The emitter region 36 is formed in the front surface of the mesa portion 30. The emitter region 36 has a first conductivity type and connects to an emitter electrode formed on the front surface side of the semiconductor substrate 110. The base region 34 has a second conductivity type differing from the first conductivity type, and is formed between the emitter region 36 and a drift region formed on the back surface side of the emitter region 36. In this example, a description is provided in which the first conductivity type is N-type and the second conductivity type is P-type. But instead, the first and second conductivity types may be the opposite conductivity types.

In this example, the semiconductor substrate 110 is (N−)-type. The drift region has the same conductivity type as the semiconductor substrate 110. The emitter region 36 is (N+)-type, and the base region 34 is (P−)-type.

In the base region 34, a channel is formed along a depth direction according to a voltage applied to the gate electrode formed inside the trench 20. The buried region 32 is (P+)-type and is formed between the base region 34 and the emitter region 36. A portion of the buried region 32 may be exposed in the front surface of the mesa portion 30 via an opening formed in the emitter region 36 and connected to the emitter electrode. With this configuration, an active portion of a power semiconductor element such as an IGBT is formed in the mesa portion 30.

In the front surface of each floating portion 10, a (P−)-type region is formed and no (N+)-type emitter region is formed. Therefore, the surface area of the emitter region 36 connected to the emitter electrode is reduced, and it is possible to limit the carriers flowing through the emitter electrode and to accumulate the carriers on the front surface side of the drift layer. In this way, it is possible to lower the ON voltage.

An interlayer insulating film is formed on the front surface of the floating portion 10. The floating portion 10 may have a contact portion 12 formed therein that penetrates through the interlayer insulating film. The contact portion 12 is a (P+)-type semiconductor region, for example, that connects the (P−)-type region of the floating portion 10 and the emitter electrode. The sheet resistance of the floating portion 10 can be controlled according to the position of the contact portion 12. In this way, it is possible to accurately control the di/dt characteristic, i.e. the slope of the current change, when the semiconductor element is turned ON.

The outside wiring portion 50 is formed along an arrangement direction (the x direction in this example) of the mesa portions 30 and the floating portions 10, outside of the regions surrounded by the trenches 20. The outside wiring portion 50 need not be formed strictly parallel to this arrangement direction. The phrase "formed along the arrangement direction" means that the outside wiring portion 50 has a portion opposite at least one mesa portion 30 and a portion opposite at least one floating portion 10. The outside wiring portion 50 is electrically connected to the gate electrodes formed inside the trenches 20. The outside wiring portion 50 and the gate electrodes are formed of polysilicon, for example. The outside wiring portion 50 may be formed with a ring shape along the outer periphery of the semiconductor substrate 110.

The edge of the outside wiring portion 50 on the mesa portion 30 and floating portion 10 side includes protruding portions 52 and recessed portions 54 in plan view. The protruding portions 52 are formed in at least a portion of the region opposite the floating portions 10 on the edge of the outside wiring portion 50, and are formed protruding toward the floating portion 10 side beyond the trenches 20. Portions of the protruding portions 52 that overlap with the trenches 20 are connected to the gate electrodes formed inside the trenches 20. In this way, it is possible to apply a gate voltage for driving the semiconductor element to the gate electrodes. Furthermore, since the protruding portions 52 protrude toward the floating portion 10 side, even when the lengths of the protruding portions 52 fluctuate from the setting values due to manufacturing variation or the like, the outside wiring portion 50 and the gate electrodes can be reliably connected.

The recessed portions 54 are formed in at least a portion of the region opposite the mesa portions 30 on the edge of the outside wiring portion 50, and are formed farther inside the outside wiring portion 50 than the protruding portions 52. For example, the recessed portions 54 are formed at least across the entire region opposite the mesa portions 30 on the edge of the outside wiring portion 50. The recessed portions 54 in this example are formed in the entire region opposite the mesa portions 30 and in a portion of the region opposite the floating portions 10 adjacent to the mesa portions 30. In this way, the base region 34 and the like functioning as a channel can be easily formed during manufacturing.

The (P+)-type well region 56 is formed between the end of the semiconductor substrate 110 and the mesa portions 30 and floating portions 10. The well region 56 may be formed with a ring shape along the outer periphery of the semiconductor substrate 110. The well region 56 functions as an edge termination structure that improves the breakdown voltage by weakening the focusing of the electrical field at the end of the semiconductor substrate 110.

The well region 56 is formed by doping the front surface of the semiconductor substrate 110 with impurities while using a prescribed mask. In FIG. 1, the end of this mask is shown by the dashed line 58. Impurity doping is performed while the region farther inward in the semiconductor substrate 110 than the dashed line 58 is covered by the mask. However, it should be noted that the well region 56 is formed to a position farther inward than the dashed line 58 due to thermal diffusion and the like.

Figure 2:
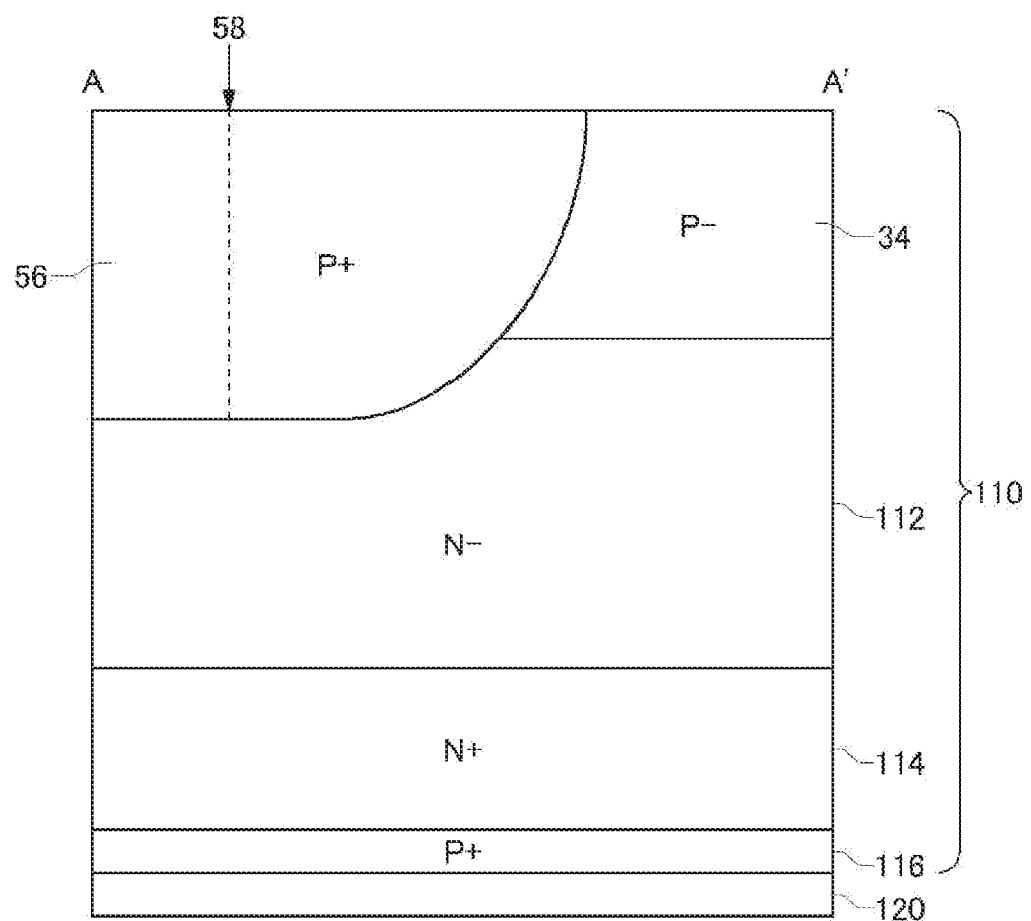
FIG. 2 shows the A-A' cross section from FIG. 1.
Figure 3:
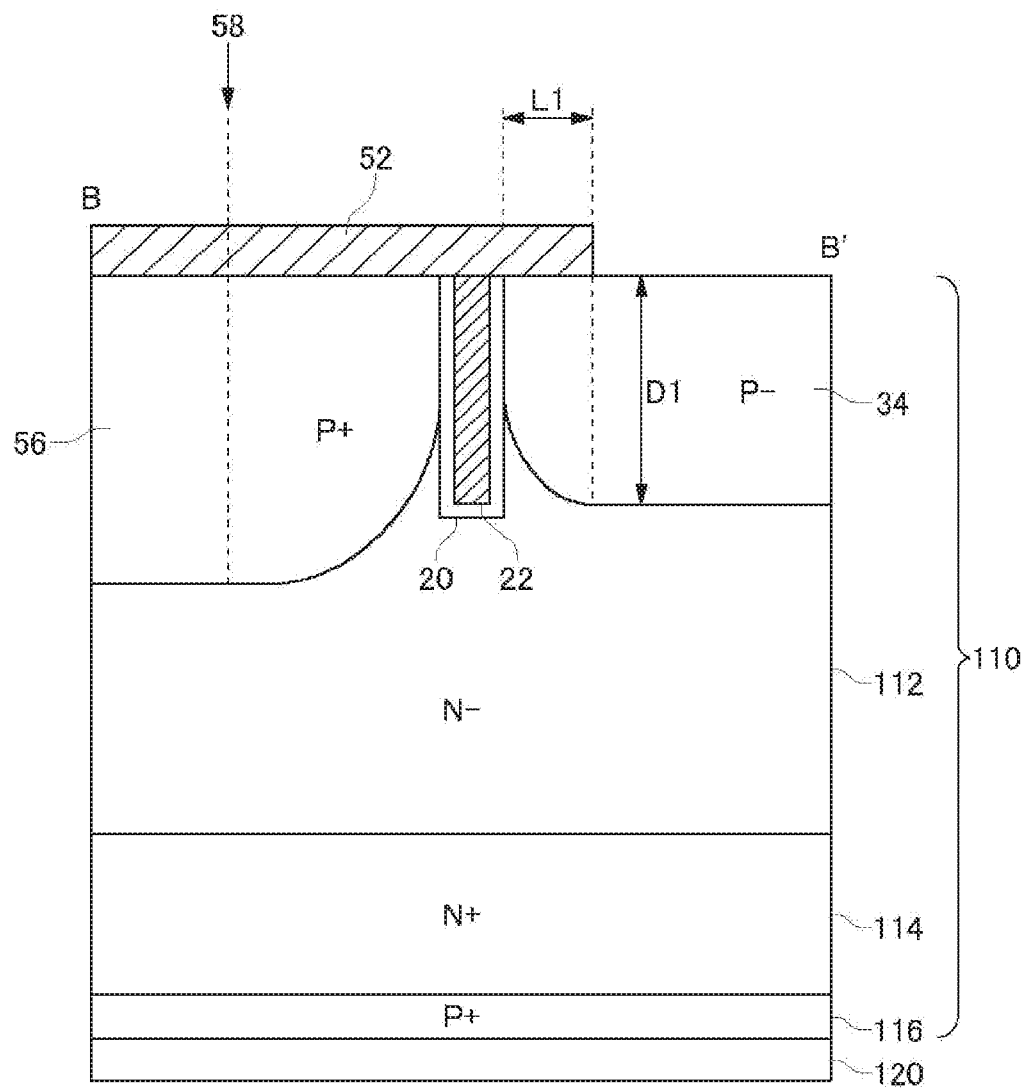
FIG. 3 shows the B-B' cross section from FIG. 1.
Figure 4:
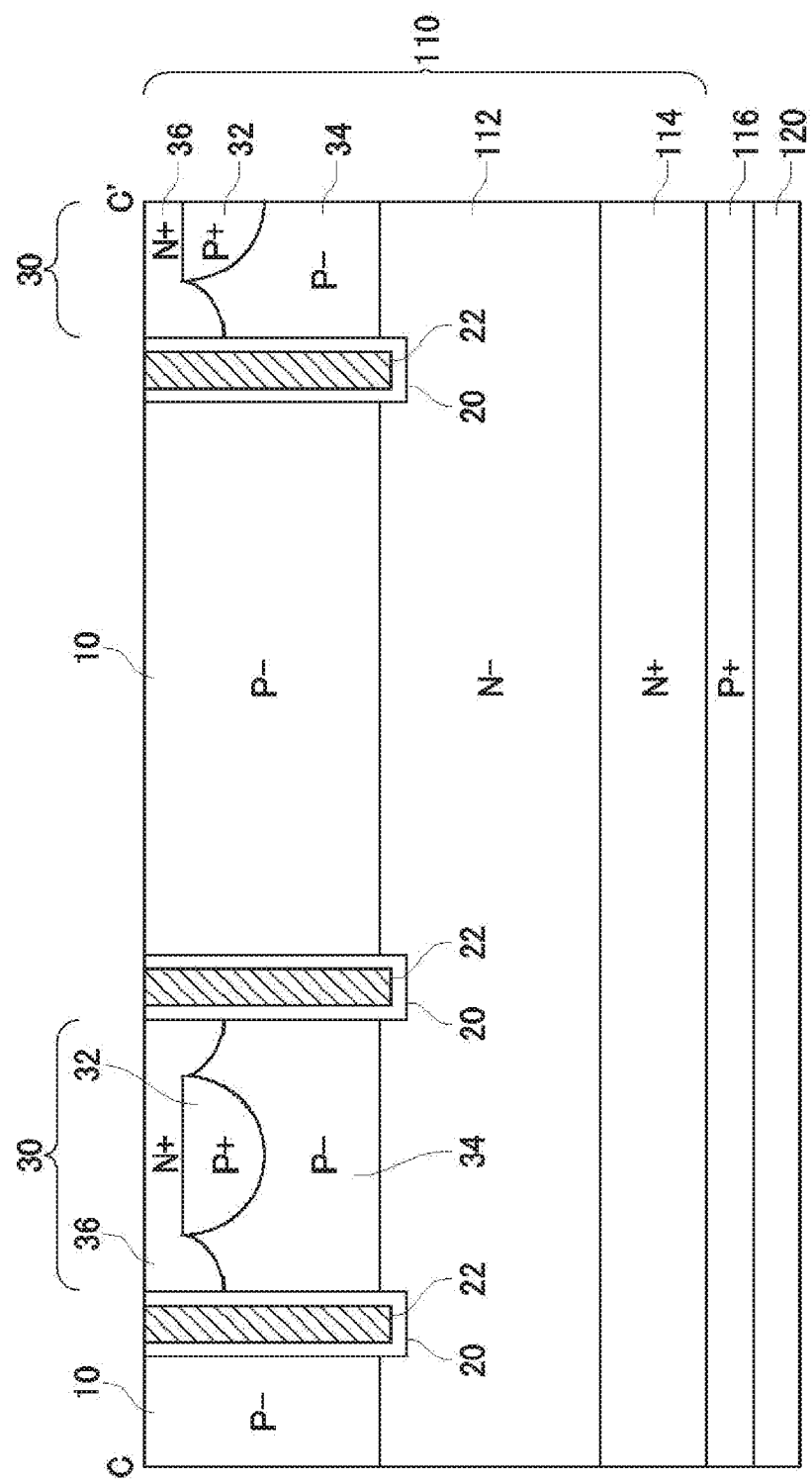
FIG. 4 shows the C-C' cross section from FIG. 1.

FIGS. 2 to 4 each show an exemplary cross section of the semiconductor device 100. FIG. 2 shows the A-A' cross section from FIG. 1. FIG. 3 shows the B-B' cross section from FIG. 1. FIG. 4 shows the C-C' cross section from FIG. 1. In FIGS. 2 to 4, the interlayer insulating film and the emitter electrodes formed on the front surface side of the semiconductor substrate 110 are not shown.

As shown in FIGS. 2 to 4, a (P−)-type base region 34, the (N−)-type drift region 112, the (N+)-type buffer region 114, and the (P+)-type collector region 116 are formed in the semiconductor substrate 110 in the stated order from the front surface side. The buffer region 114 may function as a field stop layer. The collector electrode 120 is formed on the back surface side of the collector region 116. As shown in FIGS. 2 and 3, the (P+)-type well region 56 is formed in the end of the semiconductor substrate 110. As shown in FIG. 4, the emitter region 36 doped with N-type impurities is formed on the front surface side of the base region 34. The buried region 32 may be formed between the emitter region 36 and the base region 34. The remaining base region 34 into which the N-type impurities have not been diffused is formed between the drift region 112 and the emitter region 36. When a voltage is applied to the gate electrode 22, a channel is formed in a portion of the base region 34 along the trench 20. The trench 20 is formed more deeply than the base region 34.

In the semiconductor device 100 in this example, after the well region 56, the trench 20, the gate electrode 22, and the outside wiring portion 50 have been formed, the base region 34 is formed using the outside wiring portion 50 as a mask. In this case, there are few processes performed after the formation of the base region 34, and therefore it is possible to shorten the thermal history of the base region 34 functioning as the channel. Therefore, it is possible to prevent the base region 34 from excessively diffusing in the depth direction. Accordingly the channel depth can be accurately controlled.

As shown in FIG. 3, the outside wiring portion 50 includes a protruding portion 52 protruding toward the floating portion 10 side across the trench 20. Therefore, the outside wiring portion 50 can be reliably connected to the gate electrode 22.

On the other hand, the base region 34 formed in the mesa portion 30 preferably connects to the well region 56. If the base region 34 does not reach the well region 56, the (N−)-type region of the semiconductor substrate 110 is exposed in the front surface. In such a case, the electrical field crowds in this portion and the breakdown voltage is reduced. The outside wiring portion 50 in this example includes the recessed portion 54 in the region opposite the mesa portion 30, such as shown in FIG. 1. Therefore, even when the base region 34 is formed using the outside wiring portion 50 as a mask, it is possible to connect the well region 56 and the base region 34 in the mesa portion 30, as shown in FIG. 2.

When the base region 34 is formed using the outside wiring portion 50 as the mask, the recessed portion 54 of the outside wiring portion 50 is preferably recessed toward the outside of the semiconductor substrate 110 to a position enabling the base region 34 in the mesa portion 30 to connect to the well region 56. With the semiconductor device 100 in this example, it is possible to ensure the breakdown voltage by connecting the well region 56 and the base region 34 of the mesa portion 30, while reliably connecting the outside wiring portion 50 and the gate electrode 22.

As shown in FIG. 3, the base region 34 in the surface side of the floating portion 10 is also preferably connected to the trench 20. As shown in FIG. 3, a portion of the floating portion 10 is covered by the protruding portion 52. Therefore, when the base region 34 is formed using the outside wiring portion 50 as a mask, the length L1 (a protrusion length in the y direction in this example) by which the protruding portion 52 protrudes beyond the trench 20 and inward into the floating portion 10 is preferably a length that enables the P-type impurities below the protruding portion 52 to diffuse to the trench 20. In this way, the base region 34 in the floating portion 10 covered by the protruding portion 52 can be connected to the trench 20.

Generally, it is known that the distance that the impurity region having a prescribed depth D diffuses in the horizontal direction is 0.75×D. Therefore, the length L1 by which the protruding portion 52 protrudes inward into the floating portion 10 is preferably less than or equal to D1×0.75, where D1 is the depth of the base region 34.

The width of the protruding portion 52 (the width is in the x direction in this example) is preferably less than the width of the floating portion 10. In this way, when the base region 34 is formed using the outside wiring portion 50 as the mask, it is possible to diffuse the impurities injected from both sides of the protruding portion 52 to a region below the protruding portion 52, and therefore the impurities are diffused easily in the region covered by the protruding portion 52. The width of the recessed portion 54 is preferably greater than the width of the mesa portion 30.

Figure 5:
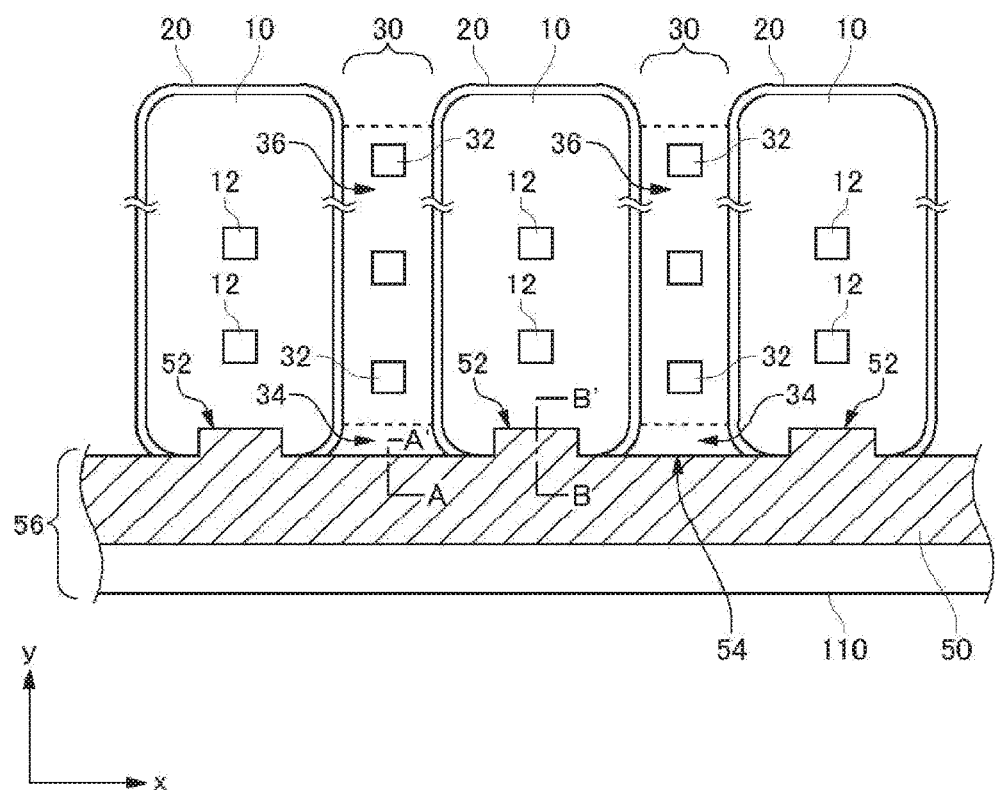
FIG. 5 shows another exemplary configuration of the semiconductor device 100.

FIG. 5 shows another exemplary configuration of the semiconductor device 100. The semiconductor device 100 in this example differs from the semiconductor device 100 shown in FIG. 1 by having a different shape for the outside wiring portion 50. The remaining configuration of this semiconductor device 100 may be the same as that of the semiconductor device 100 shown in FIG. 1. For example, the cross section at the position of the line B-B' shown in FIG. 5 is the structure shown in FIG. 3. In the outside wiring portion 50 in this example, the tip of each recessed portion 54 in the y direction is provided farther inward in the semiconductor substrate 110 than the end of each recessed portion 54 shown in FIG. 1.

Figure 6:
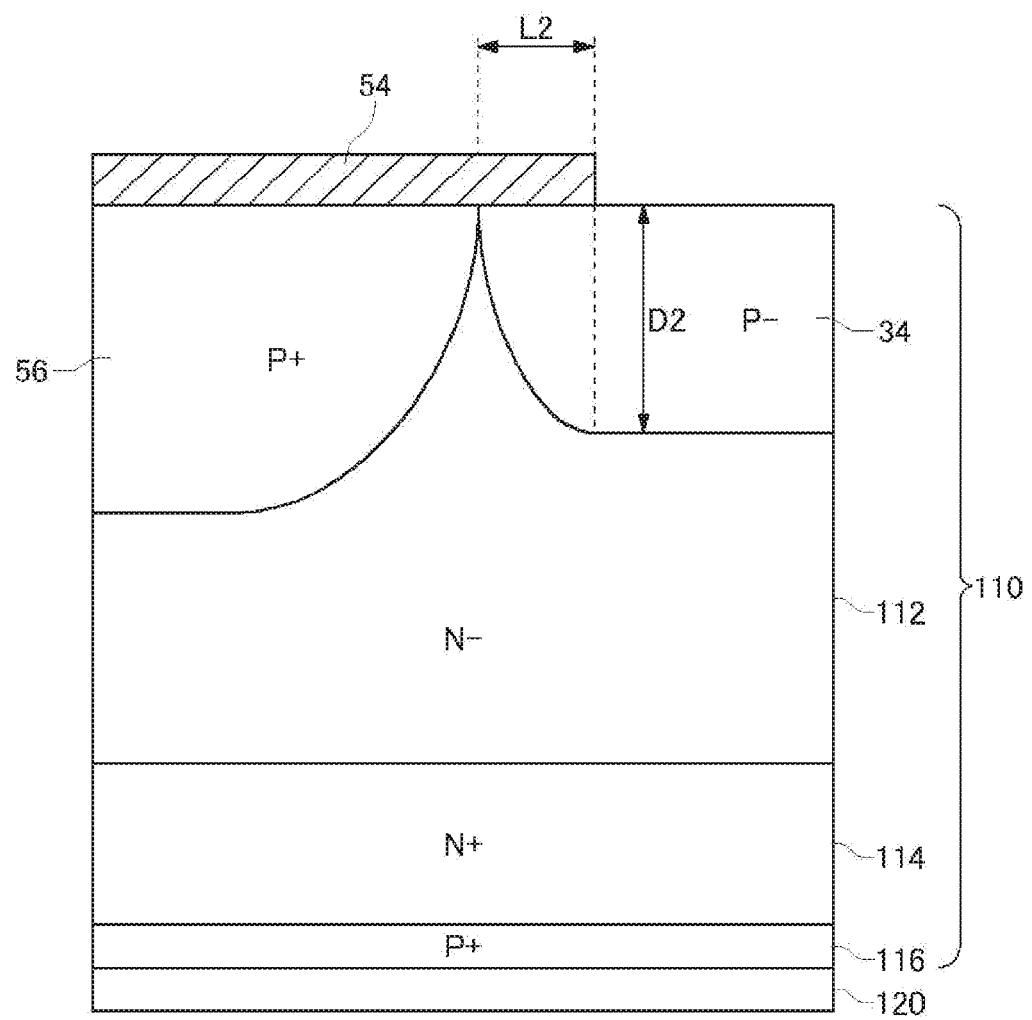
FIG. 6 shows the A-A' cross section from FIG. 5.

FIG. 6 shows the A-A' cross section from FIG. 5. As described above, the base region 34 of the mesa portion 30 is preferably connected to the well region 56. Therefore, the recessed portions 54 of the outside wiring portion 50 used as the mask for forming the base region 34 are preferably formed at positions that enable the P-type impurities of the base region 34 to diffuse to the end of the well region 56. For example, the tip of each recessed portion 54 in the y direction is arranged closer to the outside wiring portion 50 than a position protruding by 0.75 times the depth of the base region 34 toward the inside of the mesa portion 30 from the end of the well region 56 in the y direction. In other words, in each recessed portion 54, the length L2 of the region thereof protruding in the y direction beyond the end of the well region 56 is preferably less than or equal to D2×0.75, where D2 is the depth of the base region 34.

The tips of the recessed portions 54 may be closer to the outside wiring portion 50 than the end of the well region 56. In other words, the well region 56 may be exposed beyond the tips of the recessed portions 54 in the y direction. Furthermore, the tips of the recessed portions 54 may be arranged closer to the outside wiring portion 50 than the trenches 20. The well region 56 is formed at least in a range enabling connection to the trenches 20, and therefore, if the recessed portions 54 are arranged closer to the outside wiring portion 50 than the trenches 20, the base region 34 can be connected to the well region 56.

As shown in this example, by providing the tips of the recessed portions 54 inside the semiconductor substrate 110, the outside wiring portion 50 can be made smaller and the distance from the mesa portions 30 and the floating portions 10 to the end of the semiconductor substrate 110 can be reduced. In this way, the semiconductor device 100 can be miniaturized.

In order to miniaturize the semiconductor device 100 as much as possible, the tips of the recessed portions 54 are preferably arranged as far inside the semiconductor substrate 110 as possible. The y-direction position of the tips of the recessed portions 54 may be between the position of the ends of the trench 20 on the outside wiring portion 50 side and a position that protrudes by D2×0.75 in the y direction beyond the end of the well region 56. The y-direction position of the tips of the recessed portions 54 may be between the position of the end of the mask, i.e. the dashed line 58, for forming the base region 34 and a position that protrudes by D2×0.75 in the y direction beyond the end of the well region 56. As another example, the y-direction position of the tips of the recessed portions 54 may be between the position of the end of the well region 56 and a position that protrudes by D2×0.75 in the y direction beyond the end of the well region 56.

Figure 7:
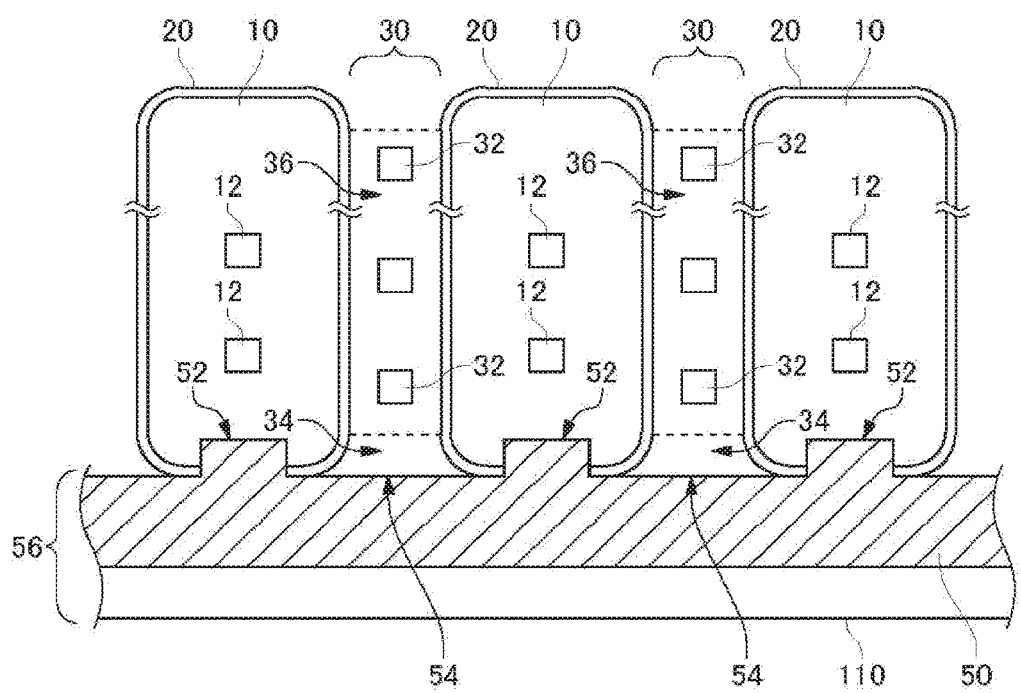
FIG. 7 shows an example in which the y-direction position of the tips of the recessed portions 54 matches the position of the ends of the trenches 20 on the outside wiring portion 50 side.

FIG. 7 shows an example in which the y-direction position of the tips of the recessed portions 54 matches the position of the ends of the trenches 20 on the outside wiring portion 50 side. As described above, the tips of the recessed portions 54 may be at a position between the position shown in FIG. 7 and a position protruding by D2×0.75 in the y direction beyond the end of the well region 56 shown in FIGS. 5 and 6.

Figure 8:
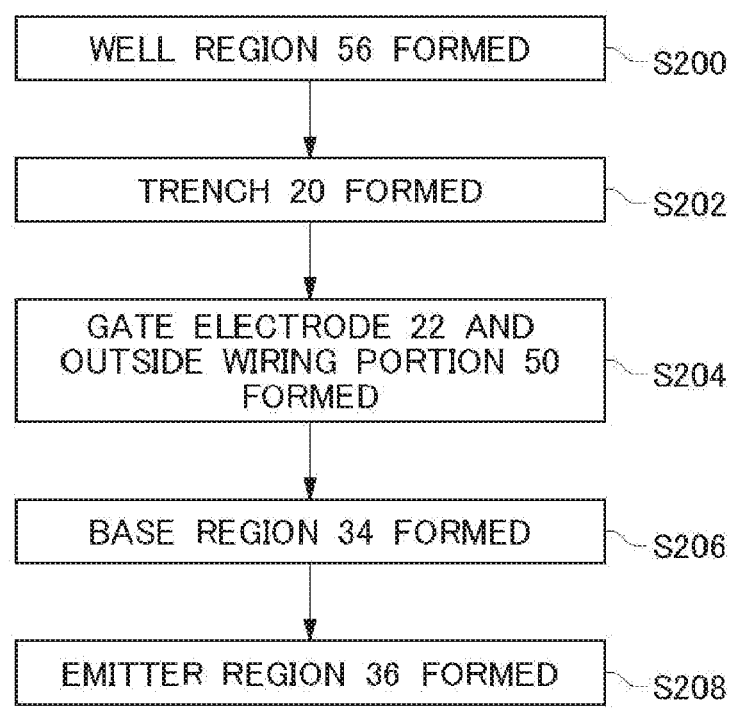
FIG. 8 shows the basics of the semiconductor device 100 manufacturing process.
Figure 9:
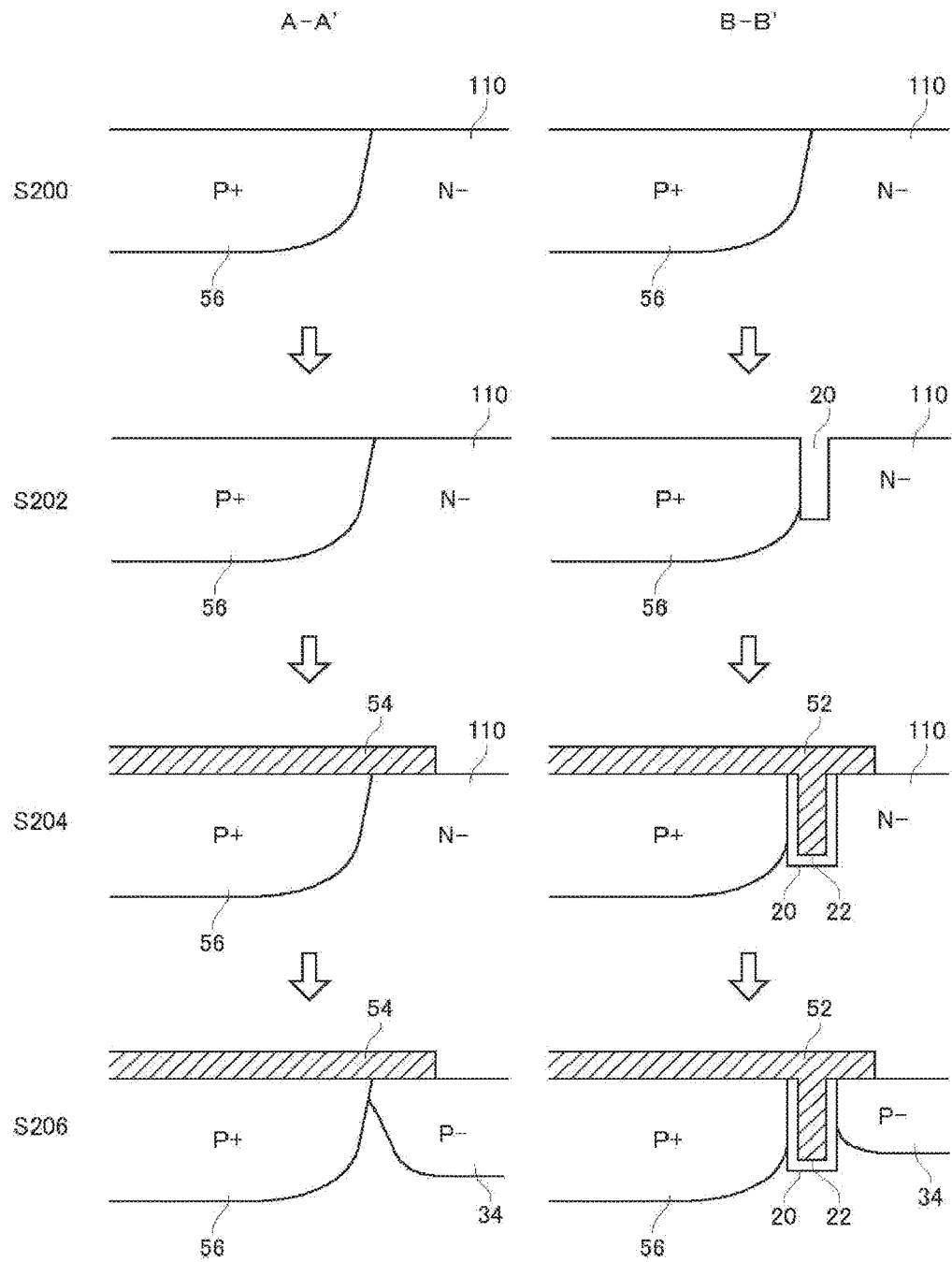
FIG. 9 shows a cross section of the semiconductor device 100 at each stage in the manufacturing process.

FIGS. 8 and 9 show an exemplary process for manufacturing the semiconductor device 100. FIG. 8 shows the basics of the manufacturing process, and FIG. 9 shows a cross section of the semiconductor device 100 at each stage. First, the (P+)-type well region 56 is formed in the outer periphery portion on the front surface of the (N−)-type semiconductor substrate 110 (S200). The semiconductor substrate 110 is a silicon substrate, for example. The position of the end of the well region 56 in the y direction matches the position where a trench 20 is to be formed.

Next, the trench 20 is formed surrounding the region corresponding to the floating portion 10 (S202). As shown in the B-B' cross section in FIG. 9, at S202, the trench 20 is formed such that the end region of the trench 20 on the outside wiring portion 50 side overlaps with the y-direction end of the well region 56. The trench 20 is formed to a depth not reaching the buffer region 114 formed on the back surface side of the semiconductor substrate 110. The trench 20 may be formed to be shallower than the well region 56. In this way, the floating portion 10 surrounded by the trench 20 and the mesa portion 30 distanced from the floating portion 10 are formed.

Next, the insulating layer is formed on the inner walls of the trench 20, and then the gate electrode 22 inside the trench 20 and the outside wiring portion 50, which includes the protruding portion 52 and the recessed portion 54, are formed (S204). The outside wiring portion 50 is formed along the arrangement direction of the floating portions 10 and the mesa portions 30, outside the region surrounded by the trench 20. The protruding portion 52 protrudes farther to the floating portion 10 side than the trench 20.

Next, using the outside wiring portion 50 as a mask, the mesa portion 30 and the floating portion 10 are doped with P-type impurities and these P-type impurities are diffused (S206). At S206, using the outside wiring portion 50 as a mask, the P-type impurities are ion-injected into the entire front surface side of the semiconductor substrate 110, and these impurities are thermally diffused. In this way, the base region 34 is formed. The base region 34 is formed to be shallower than the trench 20. By shaping the outside wiring portion 50 as described in relation to FIGS. 1 to 7, it is possible to connect the base region 34 of the mesa portion 30 to the well region 56 as shown in the A-A' cross section of FIG. 9, and to connect the base region 34 of the floating portion 10 to the trench 20 as shown in the B-B' cross section of FIG. 9.

With the manufacturing method of this example, the base region 34 functioning as the channel is formed after formation of the trench 20, the gate electrode 22, and the outside wiring portion 50, and therefore the thermal history of the base region 34 can be shortened and the depth of the base region can be accurately controlled. Furthermore, by providing the protruding portion 52, the connection between the outside wiring portion 50 and the gate electrode 22 can be made reliably, and by providing the recessed portion 54, the connection between the base region 34 and the well region 56 can be made.

After S206, using a mask with a prescribed shape, N-type impurities are ion-injected from the front surface side of the semiconductor substrate 110 to form the emitter region 36 in the base region 34 of the mesa portion 30. Furthermore, the structure on the front surface side of the semiconductor substrate 110, such as the interlayer insulating film and the emitter electrode, is formed. An opening for the contact portion 12 may be formed in the interlayer insulating film.

Next, selenium is ion-injected at approximately $1 \times 10^{14}/cm^2$, for example, from the back surface side of the semiconductor substrate 110. After the ion injection, thermal processing is performed for approximately 2 hours at a temperature of approximately 900° C., thereby forming the buffer region 114. The remaining (N−)-type region in which the buffer region 114 is not formed becomes the drift region 112. By using selenium, which has a large diffusion coefficient, the buffer region 114 can be formed more deeply than in a case where phosphorus is used, for example.

Instead of using ion injection with selenium, the buffer region 114 may be formed by performing ion injection a plurality of times using protons (H+) at different dose amounts. By using multi-stage ion injection, the impurity concentration of the buffer region 114 follows a distribution that increases gradually from the drift region 112 side to the collector region 116 side.

Next, P-type impurities are ion-injected at a dose amount approximately from $1.0 \times 10^{13}/cm^2$ to $4.0 \times 10^{13}/cm^2$, for example, from the back surface side of the semiconductor substrate 110. In this way, the collector region 116 that is thinner than the buffer region 114 is formed. After this, the collector electrode is formed on the back surface side of the semiconductor substrate 110. If the thickness of the prepared semiconductor substrate 110 is greater than a thickness corresponding to the desired breakdown voltage, before forming the buffer region 114, the semiconductor substrate 110 may be ground from the back surface side to realize a prescribed thickness.

Figure 10:
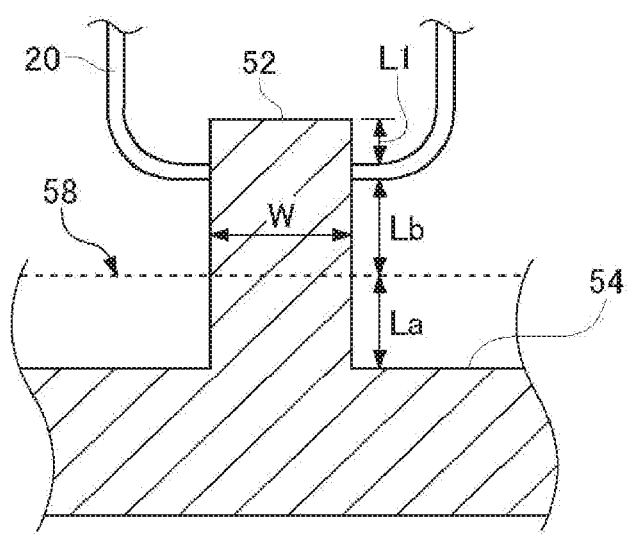
FIG. 10 shows a protruding portion 52 and a recessed portion 54.

FIG. 10 shows a protruding portion 52 and a recessed portion 54. The length L1 of a region of the protruding portion 52 that overlaps with the floating portion 10 is preferably less than or equal to 0.75 times the depth D1 of the base region 34 of the floating portion 10, as described above. For example, the length L1 is from 1.5 μm to 2.5 μm.

The width W of the protruding portion 52 is less than the width of the floating portion 10. However, it should be noted that the protruding portion 52 preferably has a width enabling a stable connection with the gate electrode 22. For example, the width W is from 4 μm to 8 μm.

The distance Lb between the end of the mask for forming the well region 56 and the end of the trench 20 is from 5.5 μm to 7.5 μm, for example. This distance corresponds to the distance that the well region 56 diffuses in the horizontal direction. In this way, the well region 56 and the floating portion 10 can be separated from each other by the trench 20.

The contact portions 12 shown in FIG. 1 may be shaped as rectangles with sides ranging from 3.5 μm to 5.5 μm. A plurality of contact portions 12 provided in a single floating portion 10 may be arranged with a pitch from 500 μm to 700 μm.

The ratio of the width of the mesa portion 30 to the width of the floating portion 10 may be from 1:3 to 1:5. The difference between the depth of the trench 20 and the depth of the base region 34 may be from 0.5 μm to 2 μm. In this way, it is possible to realize a favorable tradeoff characteristic between the ON voltage and the turn-OFF loss.

Figure 11:
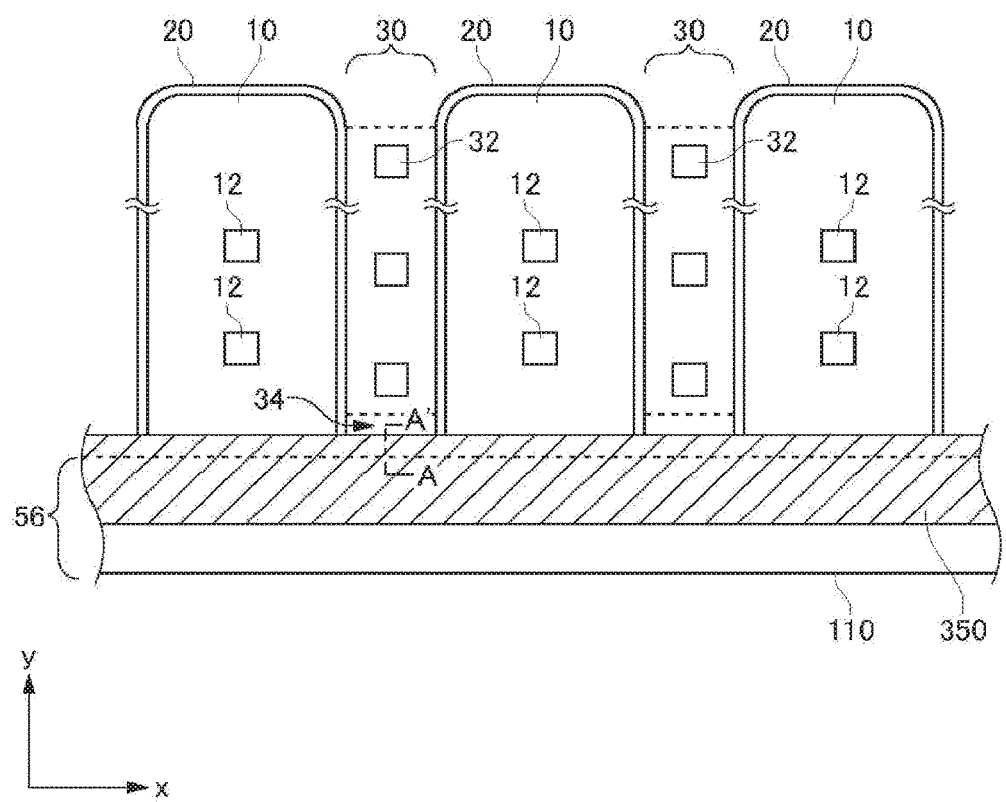
FIG. 11 shows a semiconductor device 300 as a comparative example.

FIG. 11 shows a semiconductor device 300 as a comparative example. The semiconductor device 300 in this example has an outside wiring portion 350 with a constant width in the y direction. The remaining configuration of this semiconductor device 300 may be the same as that of the semiconductor device 100 shown in FIG. 1. The outside wiring portion 350 is provided extending beyond the trench 20 to cover a portion of the floating portion 10, in the same manner as the protruding portion 52. However, since the outside wiring portion 350 does not include any recessed portions, the mesa portion 30 is covered by the same amount as the floating portion 10.

Figure 12:
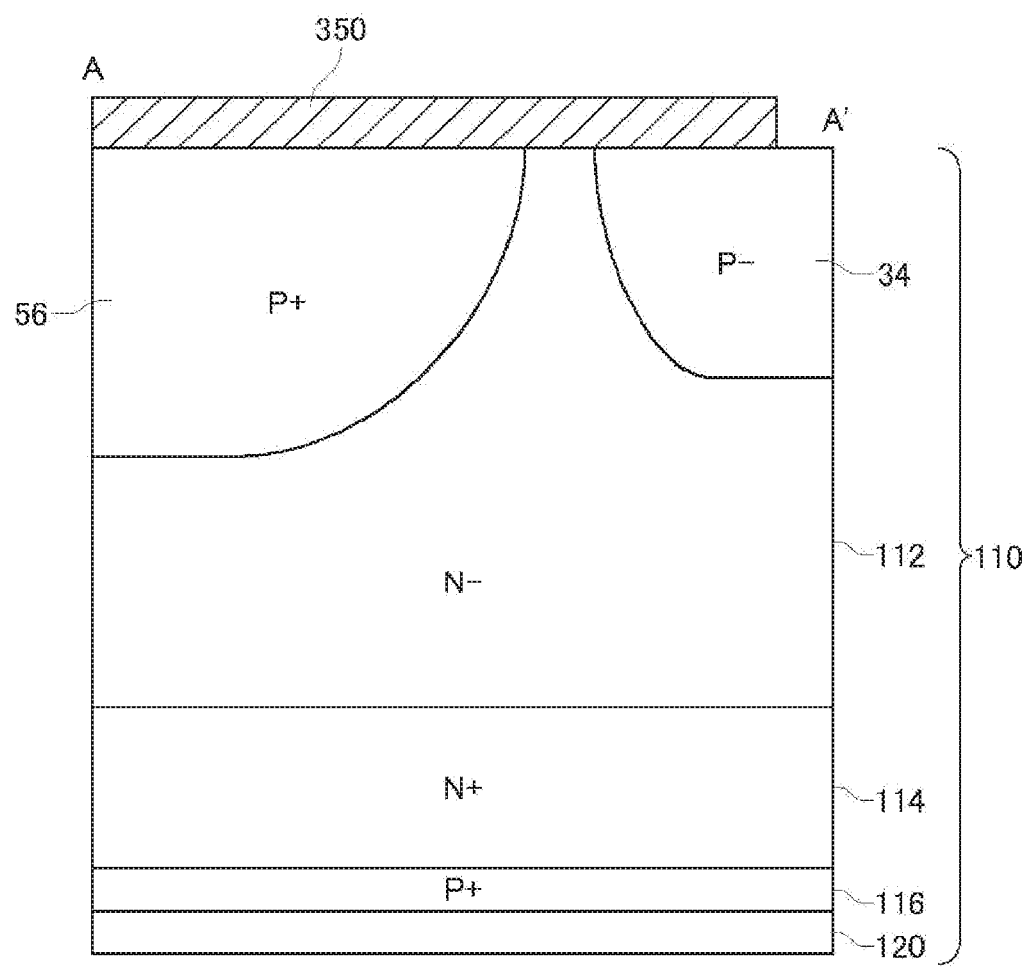
FIG. 12 shows the A-A' cross section of the semiconductor device 300.

FIG. 12 shows the A-A' cross section of the semiconductor device 300. When the base region 34 is formed using the outside wiring portion 350 shown in FIG. 11 as a mask, it is impossible for the base region 34 of the mesa portion 30 to diffuse to the end of the well region 56, as shown in FIG. 12. Therefore, the (N−)-type region is exposed in the front surface of the semiconductor substrate 110, thereby lowering the breakdown voltage. In contrast to this, since the semiconductor device 100 includes the recessed portions 54, the base region 34 of the mesa portion 30 can diffuse to the end of the well region 56, and the breakdown voltage can be maintained.

Figure 13:
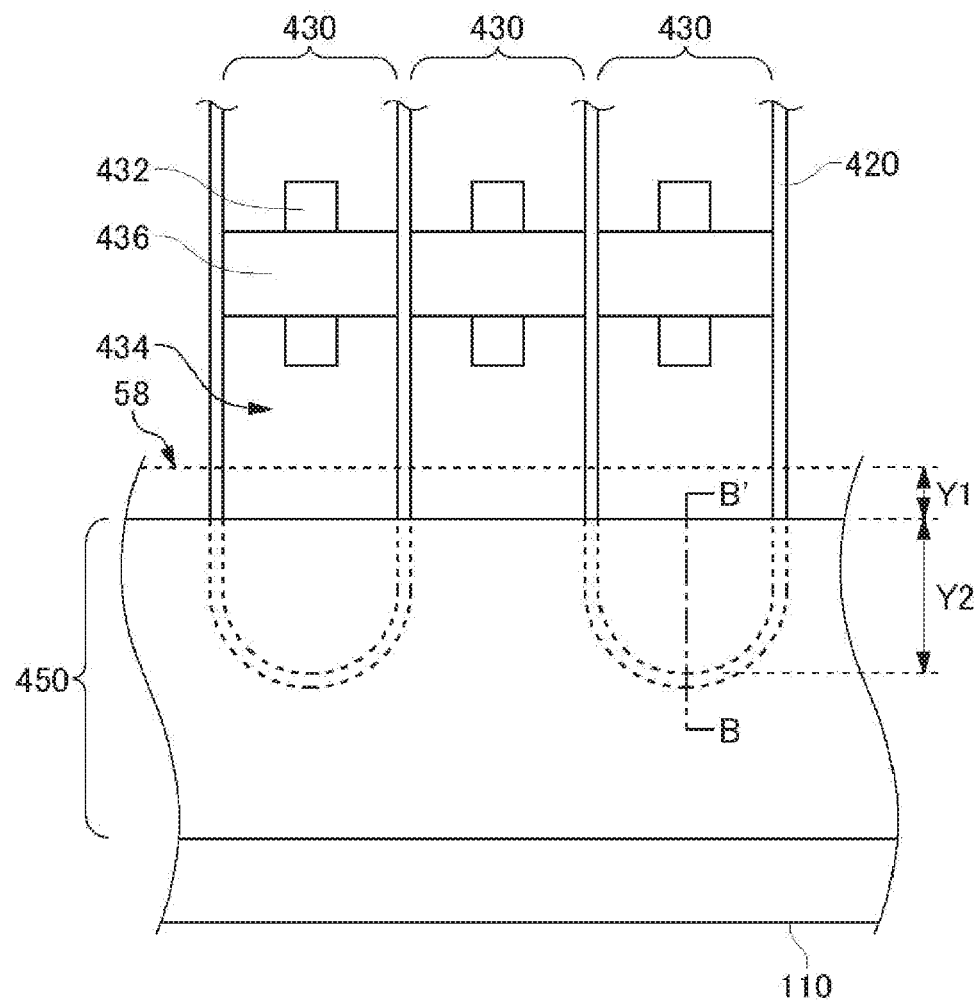
FIG. 13 shows a semiconductor device 400 as a comparative example.

FIG. 13 shows a semiconductor device 400 as a comparative example. The semiconductor device 400 in this example has a so-called full trench structure, and does not include any floating portions. The trenches 420 separate a plurality of mesa portions 430 from each other. Each mesa portion 430 includes a (P−)-type base region 434, a (P+)-type buried region 432, and an (N−)-type emitter region 436.

Figure 14:
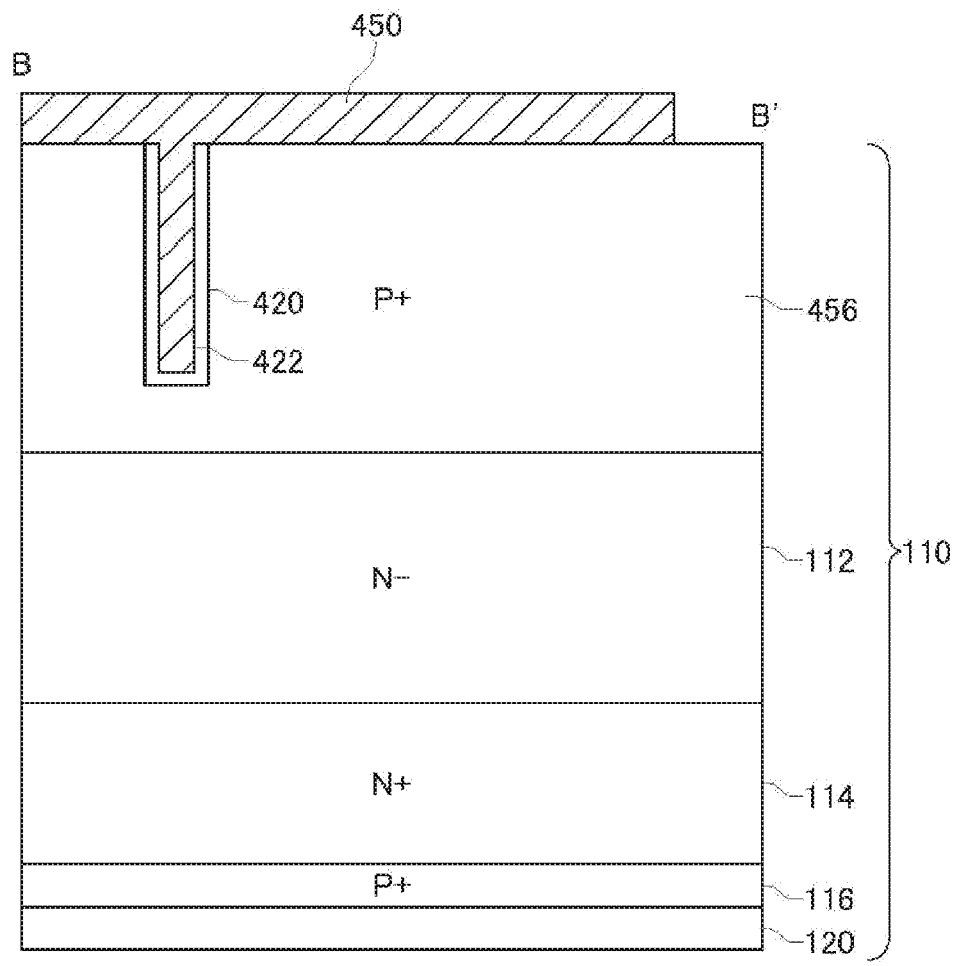
FIG. 14 shows the B-B' cross section of the semiconductor device 400.

FIG. 14 shows the B-B' cross section of the semiconductor device 400. In the semiconductor device 400, the well region 456 and the base region 434 are formed before forming the trench 420. The trench 420, the gate electrode 422, and the outside wiring portion 450 are then formed. Therefore, the well region 456 and the base region 434 can be connected to each other, but the base region 434 functioning as a channel diffuses in the depth direction during steps such as forming the trench 420 and the outside wiring portion 450, and therefore the depth of the channel cannot be accurately controlled. In contrast to this, in the semiconductor device 100, even when the base region 34 is formed after formation of the outside wiring portion 50, the well region 56 and the base region 34 can be connected to each other. Therefore, the base region 34 can be prevented from diffusing in the depth direction.

Figure 15:
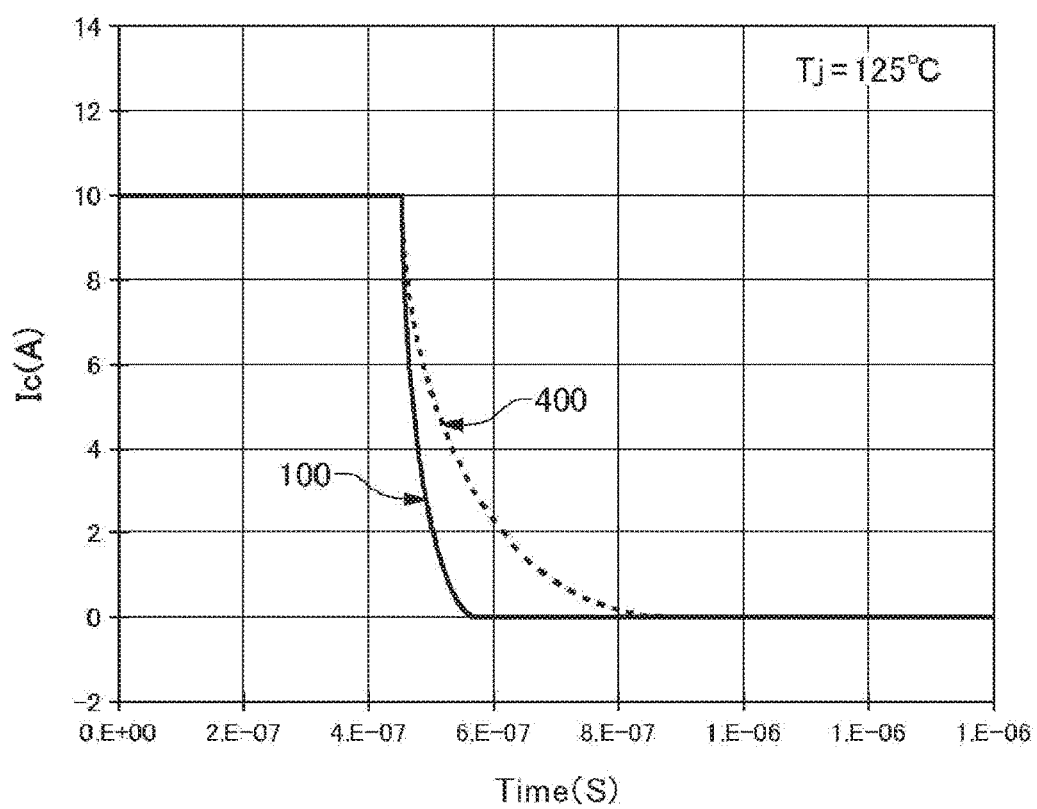
FIG. 15 shows a comparison of the turn-OFF current characteristics between the semiconductor device 100 shown in FIG. 1 and the semiconductor device 400 shown in FIG. 13.

FIG. 15 shows a comparison of the turn-OFF current characteristics between the semiconductor device 100 shown in FIG. 1 and the semiconductor device 400 shown in FIG. 13. In FIG. 15, the horizontal axis indicates time and the vertical axis indicates current flowing through the semiconductor device 400. As shown in FIG. 15, it is understood that with the semiconductor device 100, the interval during which the tail current flows can be shortened and high-speed switching can be realized. On the other hand, since the semiconductor device 400 does not include any floating portions, the gate capacitance is high and the interval during which the tail current flows is long.

Figure 16:
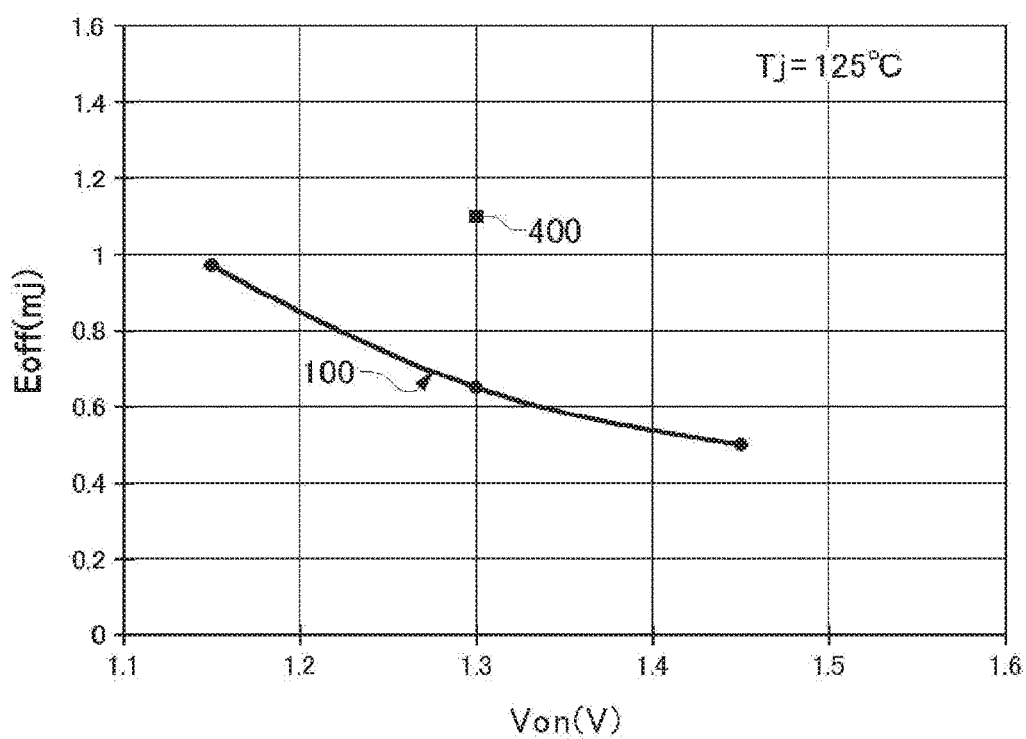
FIG. 16 shows the relationship between the ON voltage Von and the turn-OFF loss Eoff of the semiconductor device 100.

FIG. 16 shows the relationship between the ON voltage Von and the turn-OFF loss Eoff of the semiconductor device 100. FIG. 16 also shows the relationship between the ON voltage Von and the turn-OFF loss Eoff of the semiconductor device 400 for comparison. In the semiconductor device 100, the ratio of the width of the mesa portion 30 to the width of the floating portion 10 is in a range from 1:3 to 1:5 and the difference between the depth of the trench 20 and the depth of the base region 34 is in a range from 0.5 µm to 2 µm, and therefore it is possible to realize both a decrease in the turn-OFF loss due to the decrease in the gate capacitance and a decrease in the ON voltage due to the electron injection enhancement effect.

Figure 17:
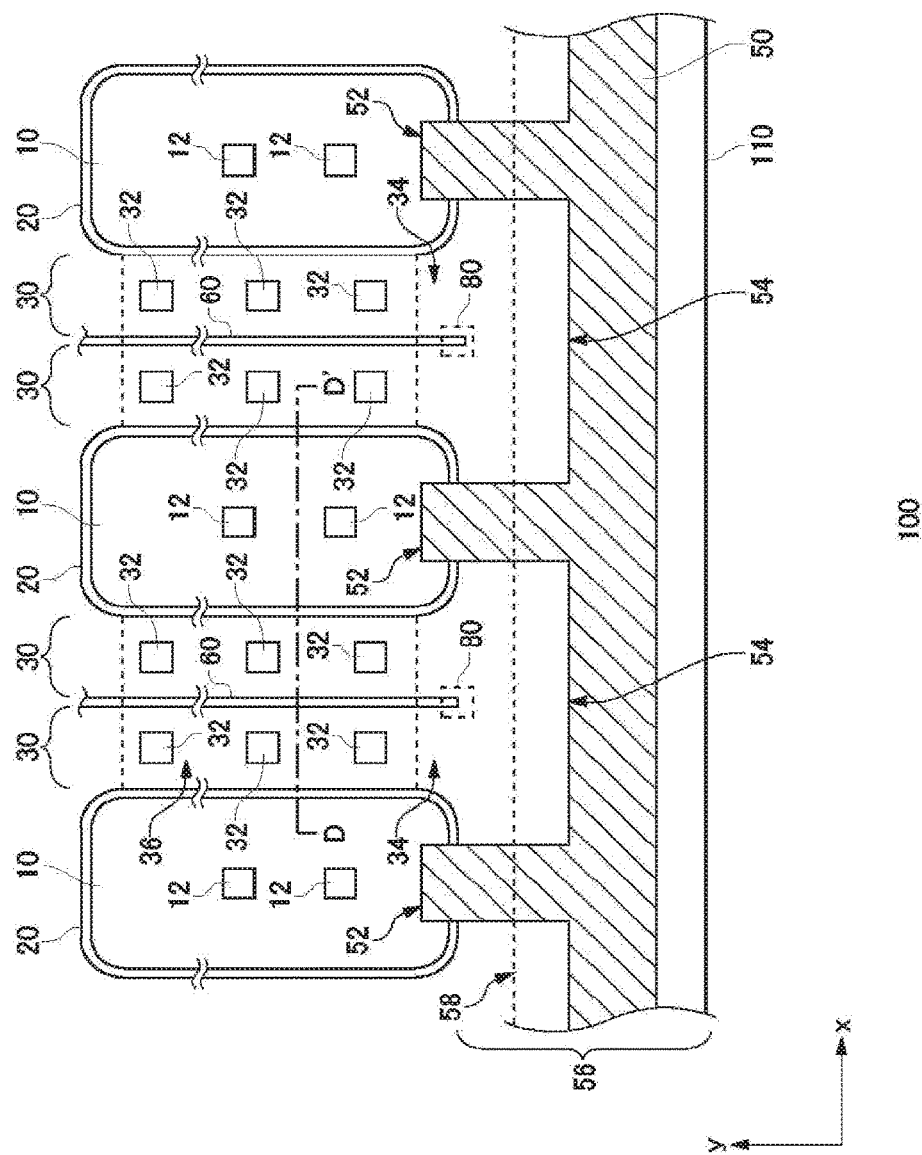
FIG. 17 is a planar view of another exemplary semiconductor device 100.

FIG. 17 is a planar view of another exemplary semiconductor device 100. The semiconductor device 100 in this example differs from the semiconductor device 100 shown in any one of FIGS. 1 to 16 with regard to the structure between two trenches 20. The remaining structure of this semiconductor device 100 may be the same as that of the semiconductor device 100 shown in any one of FIGS. 1 to 16. FIG. 17 shows a case where the outside wiring portion 50 is shaped as shown in FIG. 1.

In the semiconductor device 100 in this example, a mesa portion 30, a dummy trench 60, and a mesa portion 30 are provided in the stated order between two trenches 20. Each mesa portion 30 may have the same structure as the mesa portion 30 of the semiconductor device 100 shown in FIG. 1 or the like. However, it should be noted that the dummy trench 60 is provided between the two mesa portions 30.

The dummy trench 60 may be arranged in the center of the region between the two trenches 20 on respective sides thereof. The dummy trench 60 may be arranged in parallel with the two trenches 20 on respective sides thereof. The dummy trench 60 in this example has a longitudinal direction in the y direction.

An electrode is formed inside the dummy trench 60. An insulating film is formed between the electrode and the inner walls of the dummy trench 60. The electrode inside the dummy trench 60 in this example is electrically connected to an emitter electrode in a power semiconductor element having a trench gate structure, for example.

The semiconductor device 100 includes a connecting portion 80 that electrically connects the emitter electrode and the internal electrode of the dummy trench 60. The connecting portion 80 is provided in the end of the dummy trench 60 on the outside wiring portion 50 side, for example. The connecting portion 80 may include a dummy trench wiring portion that electrically connects to the internal electrode of the dummy trench 60 and a contact hole for electrically connecting the dummy trench wiring portion to the emitter electrode. The connecting portion 80 may be provided in a region of a recessed portion 54.

The dummy trench wiring portion is formed in the same layer as the outside wiring portion 50, in a region that is not in contact with the outside wiring portion 50. The dummy trench wiring portion may be formed of the same material as the outside wiring portion 50. The dummy trench wiring portion is formed of polysilicon, for example. The contact hole described above is provided penetrating through the interlayer insulating film on the front surface of the semiconductor device 100.

By providing the dummy trench 60, it is possible to increase the electron injection enhancement effect and to lower the ON voltage. The end of the dummy trench 60 may be provided at the same position as the end of the trench 20 in the y direction. The end of the dummy trench 60 may reach the well region 56 in the front surface of the semiconductor device 100, or may be formed inside the base region 34.

The end of the dummy trench 60 in the y direction may protrude farther than the end of the trench 20 in the y direction toward the recessed portion 54 side of the outside wiring portion 50. However, it should be noted that the dummy trench 60 does not contact the outside wiring portion 50. In the example shown in FIG. 5 and FIG. 7, the end of the dummy trench 60 would be provided farther on the emitter region 36 side than the end of the trench 20.

Figure 18:
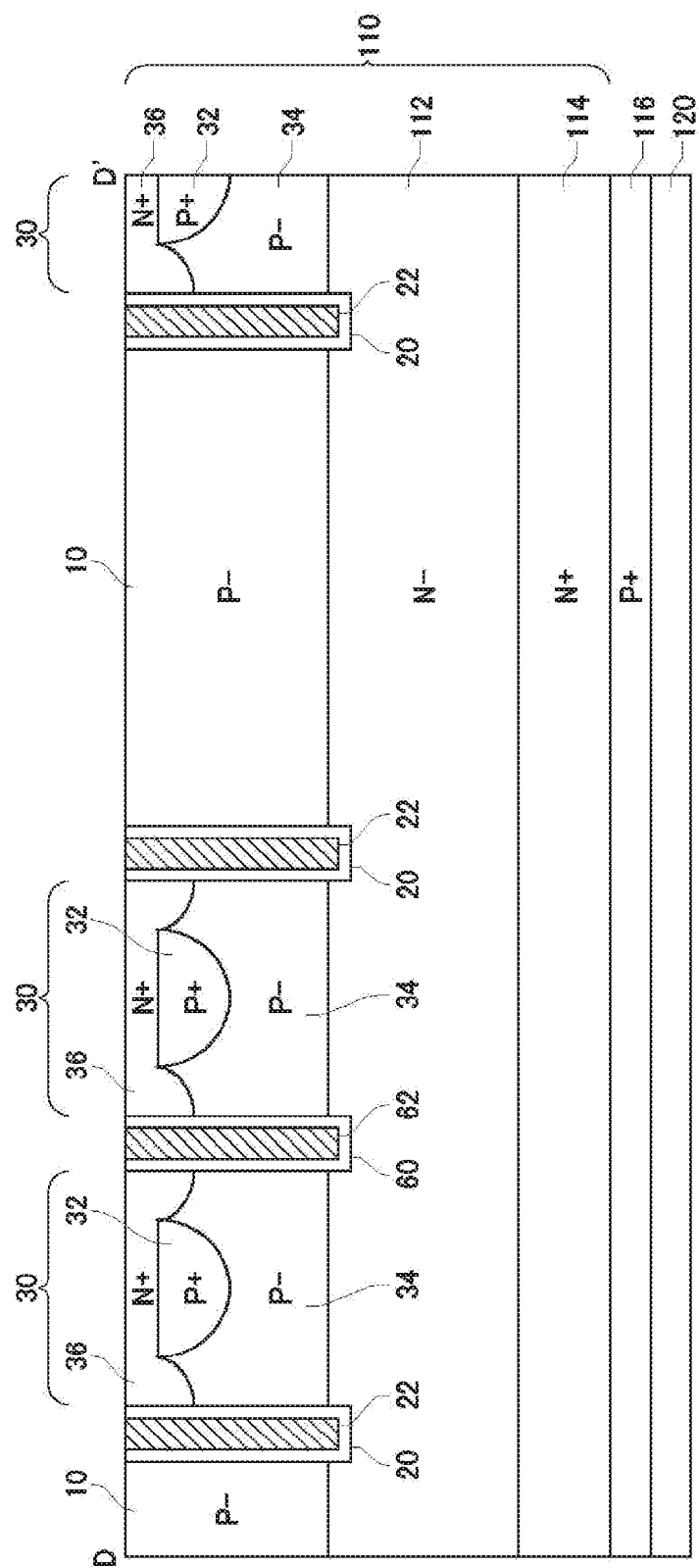
FIG. 18 shows the D-D' cross section from FIG. 17.

FIG. 18 shows the D-D' cross section from FIG. 17. FIG. 18 does not show the interlayer insulating film and emitter electrode formed on the front surface side of the semiconductor substrate 110.

As described in FIG. 17, in the semiconductor device 100 in this example, a mesa portion 30, the dummy trench 60, and a mesa portion 30 are provided between two trenches 20. The dummy trench 60 is provided in a manner to separate the two mesa portions 30 from each other between the two trenches 20.

The dummy trench 60 is provided in a manner to penetrate through the base region 34 and reach the drift region 112. The electrode 62 is formed inside the dummy trench 60 with an insulating film interposed therebetween. The electrode 62 is electrically connected to the emitter electrode described above.

The dummy trench 60 may be formed through the same process as used for the trenches 20. The dummy trench 60 may have a width in the x direction greater than that of the trenches 20. In this case, the IE effect can be further increased. If the dummy trench 60 is formed with a relatively large width using the same process as used for the trenches 20, the dummy trench 60 is formed to a deeper position than the trenches 20.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: floating portion, 12: contact portion, 20: trench, 22: gate electrode, 30: mesa portion, 32: buried region, 34: base region, 36: emitter region, 50: outside wiring portion, 52: protruding portion, 54: recessed portion, 56: well region, 58: dashed line, 60: dummy trench, 62: electrode, 80: connecting portion, 100: semiconductor device, 110: semiconductor substrate, 112: drift region, 114: buffer region, 116: collector region, 120: collector electrode, 300: semiconductor device, 350: outside wiring portion, 400: semiconductor device, 420: trench, 422: gate electrode, 430: mesa portion, 432: buried region, 434: base region, 436: emitter region, 450: outside wiring portion, 456: well region

What is claimed is:

1. A semiconductor device comprising:
a mesa portion formed on a front surface side of a semiconductor substrate, the semiconductor substrate having a first conductivity type;
a floating portion formed on the front surface side of the semiconductor substrate;
a trench that is formed surrounding the floating portion and separates the mesa portion from the floating portion;
an electrode formed inside the trench; and
an outside wiring portion formed along an arrangement direction of the mesa portion and the floating portion, outside of a region surrounded by the trench, wherein an edge of the outside wiring portion on the mesa portion and floating portion side includes:
a protruding portion that is formed in at least a portion of a region opposite the floating portion and protrudes beyond the trench toward the floating portion side;
a recessed portion that is formed in at least a portion of a region opposite the mesa portion and is recessed to the outside wiring portion side farther than the protruding portion; and
a well region that has a second conductivity type and is formed between an end of the semiconductor substrate and the mesa portion and floating portion.

2. The semiconductor device according to claim 1, wherein
the mesa portion has a base region with a second conductivity type, and
the base region and the well region are connected to each other.

3. The semiconductor device according to claim 1, wherein
a tip of the recessed portion is arranged farther on the outside wiring portion side than the trench.

4. The semiconductor device according to claim 1, wherein
the floating portion has a second conductivity type, and
a region having the second conductivity type in the floating portion that is covered by the protruding portion is connected to the trench.

5. The semiconductor device according to claim 1, wherein
width of the protruding portion is less than width of the floating portion.

6. The semiconductor device according to claim 1, wherein
width of the recessed portion is greater than width of the mesa portion.

7. The semiconductor device according to claim 2, wherein
the recessed portion is recessed to the outside wiring portion side to a position enabling the base region and the well region to connect to each other.

8. The semiconductor device according to claim 2, wherein
a tip of the recessed portion is arranged farther to the outside wiring portion side than a position that protrudes by 0.75 times a depth of the base region toward the inside of the mesa portion from an end of the well region.

9. The semiconductor device according to claim 4, wherein
the protruding portion has a length that enables the region of the floating portion having the second conductivity type to connect to the trench below the protruding portion.

10. The semiconductor device according to claim 9, wherein
length of a region of the protruding portion overlapping with the floating portion is less than or equal to 0.75 times a depth of the floating portion.

11. A semiconductor device manufacturing method comprising:
on a front surface side of a semiconductor substrate, forming a trench that surrounds a predetermined region, a floating portion surrounded by the trench, and a mesa portion separated from the floating portion, the semiconductor substrate having a first conductivity type;
forming an electrode in the trench and forming an outside wiring portion along an arrangement direction of the mesa portion and the floating portion outside of the region surrounded by the trench; and
doping the mesa portion and the floating portion with impurities having a predetermined conductivity type, using the outside wiring portion as a mask, and diffusing the impurities, wherein
forming the outside wiring portion includes forming, on an edge of the outside wiring portion that is on the mesa portion and floating portion side:
a protruding portion that is arranged in at least a portion of a region opposite the floating portion and protrudes beyond the trench toward the floating portion side; and
a recessed portion that is arranged in at least a portion of a region opposite the mesa portion and is recessed to the outside wiring portion side farther than the protruding portion, and
the semiconductor device manufacturing method further comprises, before the forming the trench, forming a well region that has a second conductivity type between an end of the semiconductor substrate and the mesa portion and floating portion.

12. The semiconductor device manufacturing method according to claim 11, wherein
the doping with the impurities and diffusing the impurities includes doping with impurities having a second conductivity type and diffusing the impurities to form a base region connected to the well region in the mesa portion.

13. The semiconductor device manufacturing method according to claim 11, wherein
the doping with the impurities and diffusing the impurities includes doping with impurities having a second conductivity type, diffusing the impurities, and connecting a region having the second conductivity type in the floating portion covered by the protruding portion to the trench.

* * * * *